United States Patent
Yao et al.

(10) Patent No.: US 8,878,345 B2
(45) Date of Patent: Nov. 4, 2014

(54) STRUCTURAL BODY AND METHOD FOR MANUFACTURING SEMICONDUCTOR SUBSTRATE

(75) Inventors: Takafumi Yao, Tsukuba (JP); Hyun-Jae Lee, Gimpo Si (KR); Katsushi Fujii, Tondabayashi (JP)

(73) Assignee: AETech Corporation, Tokyo (JP)

( * ) Notice: Subject to any disclaimer, the term of this patent is extended or adjusted under 35 U.S.C. 154(b) by 277 days.

(21) Appl. No.: 13/577,117

(22) PCT Filed: Feb. 8, 2011

(86) PCT No.: PCT/JP2011/052604
§ 371 (c)(1),
(2), (4) Date: Nov. 20, 2012

(87) PCT Pub. No.: WO2011/099469
PCT Pub. Date: Aug. 18, 2011

(65) Prior Publication Data
US 2013/0062739 A1    Mar. 14, 2013

(30) Foreign Application Priority Data
Feb. 10, 2010   (JP) ................................ 2010-028184

(51) Int. Cl.
*H01L 21/20* (2006.01)
*H01L 29/04* (2006.01)
*H01L 21/02* (2006.01)
*C30B 29/40* (2006.01)
*C30B 25/18* (2006.01)

(52) U.S. Cl.
CPC .......... *C30B 29/403* (2013.01); *H01L 21/0262* (2013.01); *H01L 21/0254* (2013.01); *H01L 21/02433* (2013.01); *H01L 21/02658* (2013.01); *H01L 21/0242* (2013.01); *C30B 25/18* (2013.01)

USPC ...... 257/627; 257/613; 257/94; 257/E21.121; 257/E29.004

(58) Field of Classification Search
CPC ..... H01L 33/20; H01L 33/0079; H01L 33/38; H01L 21/0242; H01L 33/30; H01L 21/02433; H01L 33/16; H01L 29/04
USPC ............. 257/627, E21.121, E29.004, 94, 613
See application file for complete search history.

(56) References Cited

U.S. PATENT DOCUMENTS

| | | | |
|---|---|---|---|
| 2002/0033521 | A1 | 3/2002 | Matsuoka |
| 2009/0197118 | A1 | 8/2009 | Nagai et al. |
| 2010/0207136 | A1 | 8/2010 | Armitage et al. |
| 2010/0244087 | A1* | 9/2010 | Horie et al. .................. 257/103 |

FOREIGN PATENT DOCUMENTS

| | | |
|---|---|---|
| JP | 2002 64201 | 2/2002 |
| JP | 2002 145700 | 5/2002 |

(Continued)

OTHER PUBLICATIONS

International Search Report Issued May 17, 2011 in PCT/JP11/52604 Filed Feb. 8, 2011.

*Primary Examiner* — Cathy N Lam
(74) *Attorney, Agent, or Firm* — Oblon, Spivak, McClelland, Maier & Neustadt, L.L.P.

(57) ABSTRACT

A structural body includes a sapphire underlying substrate; and a semiconductor layer of a group III nitride semiconductor disposed on the underlying substrate. An upper surface of the underlying substrate is a crystal surface tilted at an angle of 0.5° or larger and 4° or smaller with respect to a normal line of an a-plane which is orthogonal to an m-plane and belongs to a {11-20} plane group, from the m-plane which belongs to a {1-100} plane group.

6 Claims, 11 Drawing Sheets

(56) References Cited

FOREIGN PATENT DOCUMENTS

| JP | 2008 53594 | 3/2008 |
| JP | 2008 277655 | 11/2008 |
| JP | 2009 184842 | 8/2009 |
| JP | 2009 239250 | 10/2009 |
| WO | 2008 047907 | 4/2008 |

* cited by examiner

STRUCTURAL BODY AND METHOD FOR MANUFACTURING SEMICONDUCTOR SUBSTRATE

FIELD

The present invention relates to a structural body and a method for manufacturing a semiconductor substrate.

BACKGROUND

A group III nitride semiconductor attracts attention as a material for a next generation low power consumption illumination or a radio frequency and high power electronic device. The group III nitride semiconductor is applied to ultraviolet, blue, green, and white light emitting diodes or ultraviolet, blue, and green laser diodes, or a radio frequency and high power electronic device. Specifically, for the illumination purpose studies on a method of manufacturing a high power light emitting diode as an alternative to a fluorescent lamp are being actively conducted.

When the group III nitride semiconductor is grown on a underlying substrate, in many cases, an upper surface of the underlying substrate becomes a plane of a {000} plane group. The characteristics of the group III nitride semiconductor which is grown on the plane of the {0001} plane group tend to be degraded due to spontaneous polarization effect between a group III atom and a group V atom or a piezo electric field effect caused by the big difference between an interatomic distance of the group III atom and an interatomic distance of the group V atom. In other words, when the group III nitride semiconductor is used for a light emitting element such as the light emitting diode or the laser diode, carriers in a quantum well are spatially separated and light emitting recoupling of the carriers in an active layer is hindered, which lowers efficiency in the light emitting element.

To address the problem, it has been suggested to use a plane of a no-polarity (non-polar) {1-100} plane group or a plane of a {-12-10} plane group or a plane of a small polarity (semipolar) {10-12} plane group as an upper surface of the underlying substrate. Among them, a group III nitride semiconductor obtained by growing a plane of the {1-100} plane group on the underlying substrate as the upper surface of the underlying substrate has a good doping or composition control characteristic, which may especially receive attention.

Patent Literature 1 discloses that a GaN based nitride semiconductor is crystal-grown on a sapphire substrate which has a (1-100) plane (m-plane) as a main plane. Even though the main plane of the sapphire substrate is ideally a just m-plane, the main plane may be most preferably a crystal surface which is tilted at ±0.5° or less in both a-axis direction and c-axis direction from the just m-plane as acceptable error range. By doing this, according to Patent Literature 1, it is possible to obtain a good quality epitaxial growth film of a GaN based nitride semiconductor.

CITATION LIST

Patent Literature

Patent Literature 1: Japanese Patent Application Laid-Open No. 2009-239250

SUMMARY

Technical Problem

However, as a result of the reviews of the inventors, it is found that if using the upper surface of the sapphire substrate as the just m-plane, GaN is grown on the sapphire substrate, so many bicrystals are generated in GaN and lattice mismatch between the upper surface (m-plane) of the sapphire substrate and the growth face of GaN (m-plane) is significant so that the crystallinity of GaN (group III nitride semiconductor) is not good.

An object of the present invention is to improve the crystallinity in a semiconductor layer of a group III nitride semiconductor having the m-plane as the growth face.

Solution to Problem

According to a first aspect of the present invention, there is provided a structural body, comprising: a sapphire underlying substrate; and a semiconductor layer of a group III nitride semiconductor disposed on the underlying substrate, wherein an upper surface of the underlying substrate is a crystal surface tilted at an angle of 0.5° or larger and 4° or smaller with respect to a normal line of an a-plane which is orthogonal to an m-plane and belongs to a {11-20} plane group, from the m-plane which belongs to a {1-100} plane group.

According to a second aspect of the present invention, there is provided a method for manufacturing a semiconductor substrate, comprising: a first step of, during a first period, treating an upper surface of a sapphire underlying substrate by supplying a group III raw material onto the upper surface of the underlying substrate without supplying a group V raw material in a state where the sapphire underlying substrate is heated at a first temperature; and a second step of, during a second period which follows the first period, growing a semiconductor layer of the group III nitride semiconductor on the underlying substrate by supplying the group V raw material in addition to the group III raw material on the upper surface of the underlying substrate in the state where the underlying substrate is heated at the first temperature, wherein the upper surface of the underlying substrate is a crystal surface tilted at an angle of 0.5° or larger and 4° or smaller with respect to a normal line of an a-plane which is orthogonal to an m-plane and belongs to a {11-20} plane group, from the m-plane which belongs to a {1-100} plane group.

According to a third aspect of the present invention, there is provided the method for manufacturing the semiconductor substrate according to the second aspect of the present invention, wherein a length of the first period is 10 seconds or longer and 300 seconds or shorter.

According to a fourth aspect of the present invention, there is provided the method for manufacturing the semiconductor substrate according to the second or third aspect of the present invention, further comprising: a third step of, during a third period which follows the second period, raising the temperature of the underlying substrate from the first temperature to a second temperature while supplying the group V raw material onto the upper surface of the semiconductor layer without supplying the group III raw material; and a fourth step of, during a fourth period which follows the third period, growing a second semiconductor layer of the group III nitride semiconductor on the semiconductor layer by supplying the group III raw material and the group V raw material onto the upper surface of the semiconductor layer in the state where the underlying substrate is heated at the second temperature.

Advantageous Effects of Invention

According to the present invention, it is possible to improve the crystallinity in a semiconductor layer of a group III nitride semiconductor having the m-plane as the growth face.

DESCRIPTION OF EMBODIMENTS

Figure 1:
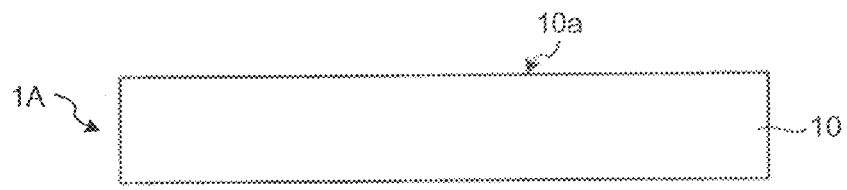
FIG. 1 is a process cross-sectional view illustrating a method of manufacturing a semiconductor substrate according to an embodiment of the present invention.
Figure 1:
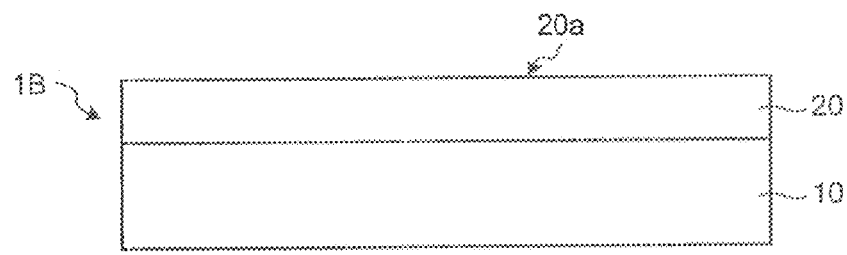
Figure 1:
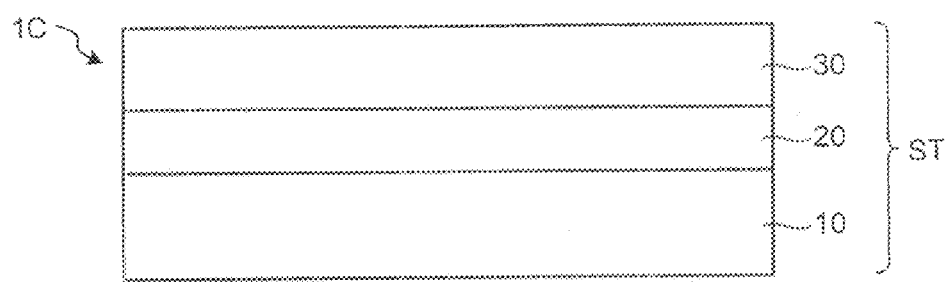
Figure 1:
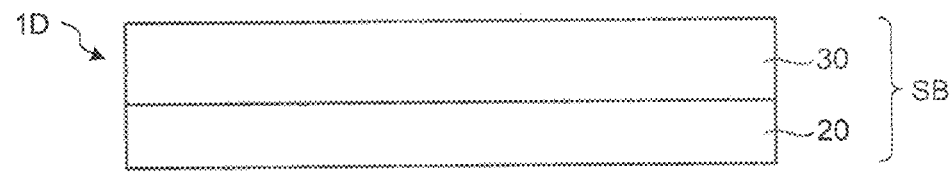
Figure 2:
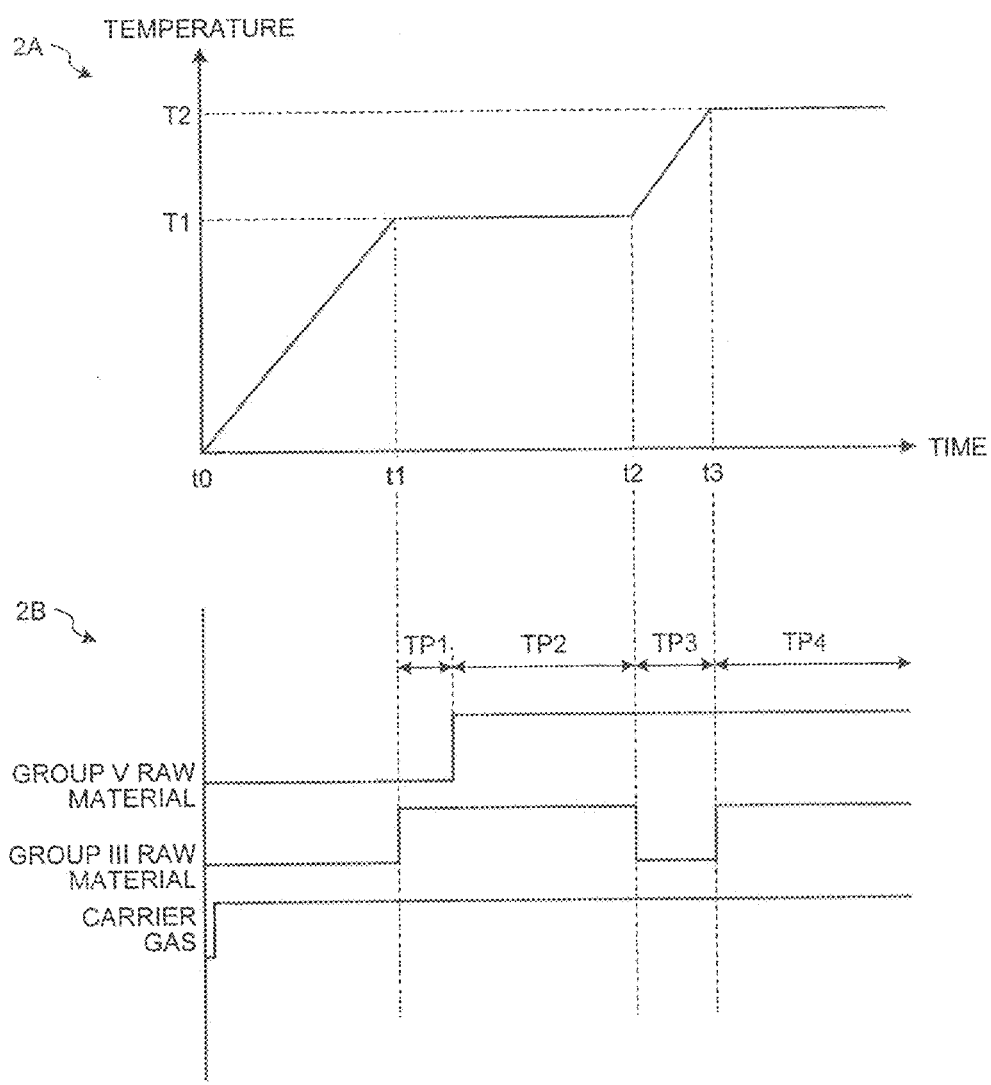
FIG. 2 is a timing flow chart illustrating a method of manufacturing a semiconductor substrate according to the embodiment of the present invention.
Figure 3:
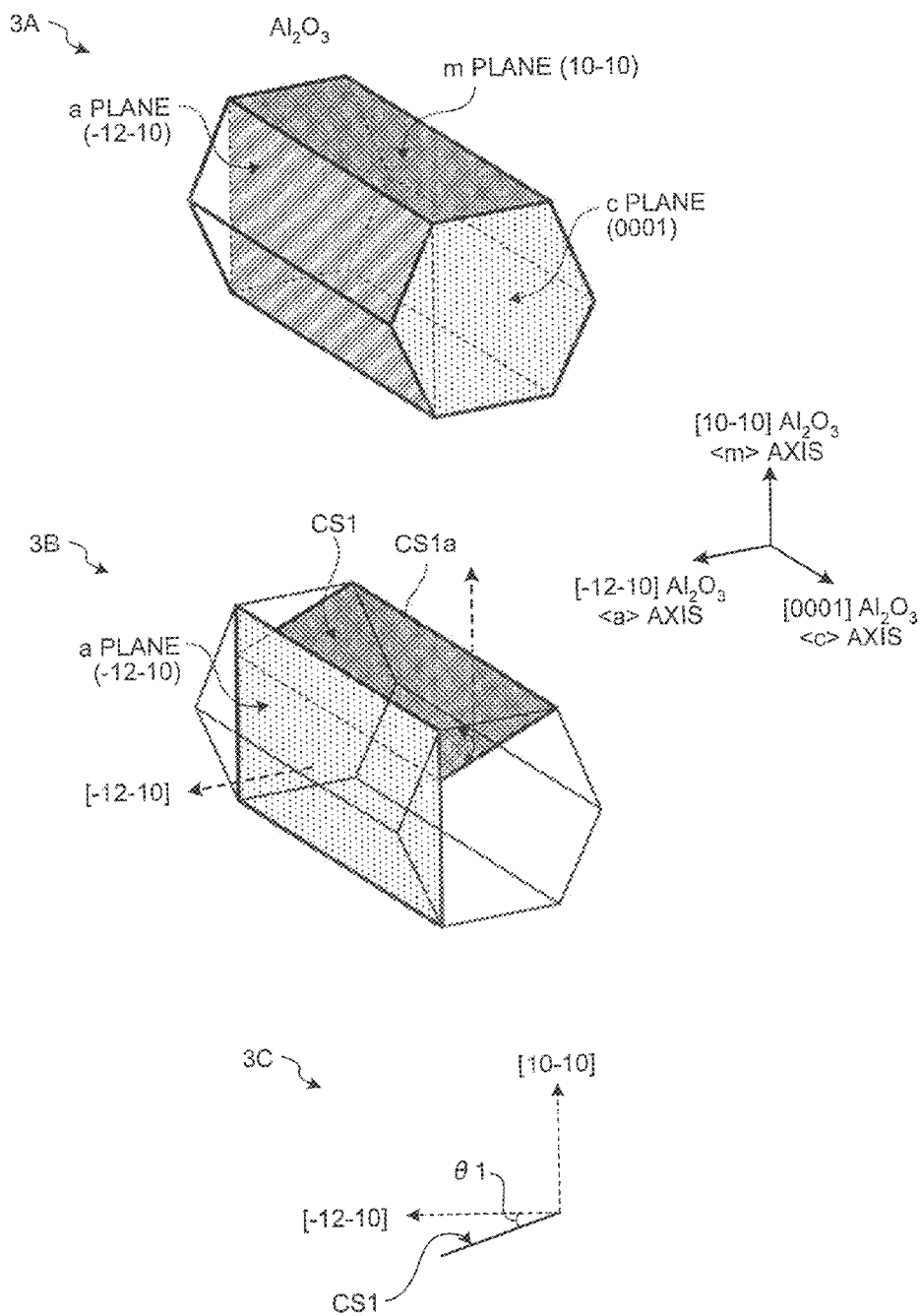
FIG. 3 is a view explaining a crystal surface according to the embodiment of the present invention.

A method of manufacturing a semiconductor substrate according to embodiments of the present invention will be described with reference to FIGS. 1 and 2. FIG. 1 is a process cross-sectional view illustrating a method of manufacturing a semiconductor substrate according to an embodiment of the present invention and FIG. 2 is a timing flow chart illustrating a method of manufacturing a semiconductor substrate according to the embodiment of the present invention. FIG. 3 is a schematic view illustrating a relationship of a surface and a crystal surface crystal orientation of a sapphire crystal used in the present invention and explains the crystal surface according to the embodiment of the present invention. Hereinafter, GaN will be mainly described as a group III nitride semiconductor. However, the description may be similar to other material system (for example, In—Ga—N, Ga—Al—N, or In—Ga—Al—N).

In a process illustrated in 1A of FIG. 1, a underlying substrate 10 is prepared. The underlying substrate 10 is formed of a single crystal sapphire ($Al_2O_3$). An upper surface 10a of the underlying substrate 10 is a crystal surface CS1 which is tilted at an angle θ1 with respect to a normal line of an a-plane from an m-plane (see FIG. 3). The m-plane belongs to a {1-100} plane group. The a-plane is a plane which is orthogonal to the m-plane and belongs to a {11-20} plane group. θ1 is a value which is 0.5° or larger and 4° or smaller. The single crystal sapphire has a crystal geometry of a pseudo hexagonal system.

As illustrated in 3A of FIG. 3, the m-plane which belongs to the {1-100} plane group is, for example, a (10-10) plane. The a-plane which is orthogonal to the m-plane and belongs to the {11-20} plane group is, for example, a (-12-10) plane. As illustrated in 3B FIG. 3, a normal line of the a-plane faces a [-12-10] orientation (which belongs to <-12-10> orientation group). In this case, as illustrated in 3C of FIG. 3, the crystal surface CS1 that forms the upper surface 10a of the underlying substrate 10 is a crystal surface which is tilted at an angle θ1 with respect to a normal line [-12-10] of the a-plane having a side CS1a which is opposite to the a-plane (-12-10) in the m-plane as an axis. The angle θ1 is a value which is 0.5° or larger and 4° or smaller.

Here, supposedly, if the angle θ1 is less than 0.5°, when a semiconductor layer (for example, GaN layer) of a group III nitride semiconductor is grown on the underlying substrate 10 in the subsequent process, a huge amount of bicrystals are generated in the semiconductor layer. Therefore, the crystallinity of the semiconductor layer may be deteriorated (see FIG. 8). Further, it is difficult to control the angle θ1 to be less than 0.5° due to the limitation of the processing accuracy of a processing device.

In contrast, in the embodiment, the angle θ1 is set to be 0.5° or larger. Therefore, when a semiconductor layer (for example, GaN layer) of the group III nitride semiconductor is grown on the underlying substrate 10 in the subsequent process, as described below, it is possible to significantly reduce the amount of the bicrystals generated in the semiconductor layer, which improves the crystallinity of the semiconductor layer (see FIG. 8).

Figure 6:
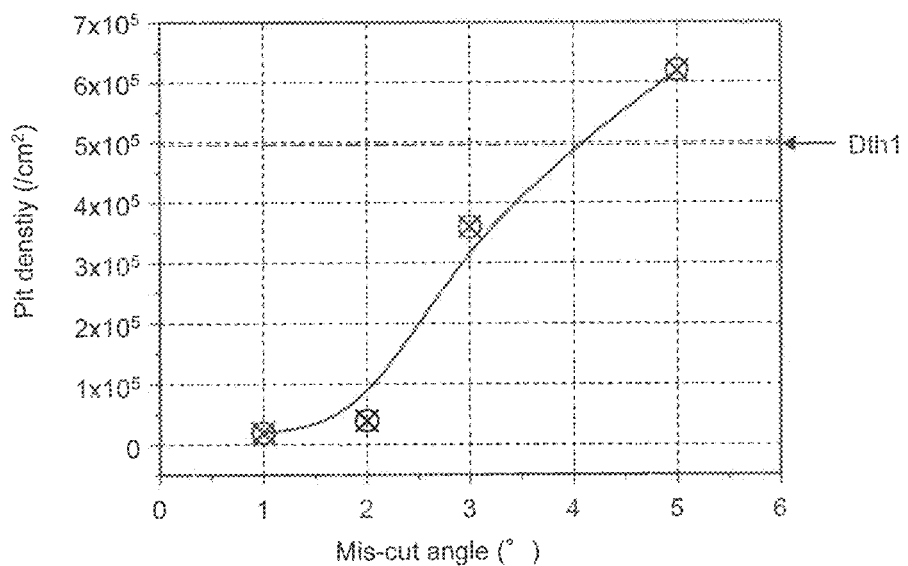
FIG. 6 is a view illustrating a relationship between a defect density and a tilted angle according to Working Example 1.

Further, supposedly, if the angle θ1 is set to be larger than 4°, when a semiconductor layer (for example, GaN layer) of a group III nitride semiconductor is grown on the underlying substrate 10 in the subsequent process, a density of a pit generated on a surface of the semiconductor layer may exceed a range which is practically allowed (that is $5\times10^5/cm^2$ or less) (see FIG. 6).

In contrast, in the embodiment, the angle θ1 is set to be 4° or less. Therefore, when a semiconductor layer (for example, GaN layer) of a group III nitride semiconductor is grown on the underlying substrate in the subsequent process, a density of a pit generated on a surface of the semiconductor layer may be within the range which is practical allowed (that is $5\times10^5/cm^2$ or less) (see FIG. 6).

Next, as illustrated in 2A of FIG. 2 during a time period t0 to t1, the underlying substrate 10 is heated from a normal temperature to a first temperature T1. The first temperature T1 is a temperature of 700° C. or higher and 900° or lower.

Here, supposedly, if the first temperature T1 is lower than 700° C., a quality of a semiconductor layer 20 of a group III nitride semiconductor on the underlying substrate 10 in the subsequent process may be deteriorated and eventually, the semiconductor layer 20 may not be grown. Further, supposedly, if the first temperature T1 is higher than 900° C., even though the semiconductor layer 20 of the group III nitride semiconductor having the m-plane as a growth face is intended to be grown, a roughness of the surface is increased or the growth face may become a mixed face with other plane orientations. Accordingly, it is difficult to obtain the semiconductor 20 having a desired growth face.

Further, in this case, as illustrated in 2B of FIG. 2, a carrier gas is supplied to the upper surface 10a of the underlying substrate 10 without supplying a group V raw material and a group III raw material. Subsequently, the carrier gas is continuously supplied onto the upper surface 10a of the underlying substrate 10. The carrier gas is a gas which is inactive to the crystal growth. The carrier gas is, for example, a hydrogen gas, a nitrogen gas, or an argon gas.

Further (first process), during a first, period TP1, in a state where the sapphire underlying substrate 10 is heated to the first temperature T1, the group III raw material is supplied onto the upper surface 10a of the underlying substrate 10 without supplying the group V raw material in order to treat the upper surface 10a of the underlying substrate 10. The group V raw material is a hydride or an organic metal of nitrogen. The group V raw material is, for example, an ammonia gas. The group III raw material is a chloride or an organic metal of a group atom. In other words, the group III raw material is a group III atom—Cl or a group III atom—$Cl_3$, or a trimethyl group III compound or triethyl group III compound which is an organic metal thereof. However, the group III raw material is not specifically limited to the illustrated material. If the group III nitride semiconductor to be grown is GaN, the group III raw material is, for example, a GaCl gas.

It should be noted that, if the group III nitride semiconductor is other material system, the group III raw material is a chloride or an organic metal of the group III atom (any one or more of In, Ga, and Al) contained therein.

Supposedly, in the first period TP1, if both the group V raw material and the group III raw material are supplied onto the upper surface 10a of the underlying substrate 10, even though the semiconductor layer 20 of the group III nitride semiconductor having the m-plane as a growth face is intended to be grown, the growth face becomes a mixed face with other plane orientations. Accordingly, it is difficult to obtain the semiconductor layer 20 having a desired growth face.

In contrast, in the embodiment, in the first period TP1, the group III raw material is supplied onto the upper surface 10a of the underlying substrate 10 without supplying the group V raw material. By doing this, the upper surface 10a of the underlying substrate 10 is treated so as to make the upper surface 10a of the underlying substrate 10 be in a state that the semiconductor layer 20 of the group III nitride semiconductor having the m-plane as a growth face is easily grown thereon. Therefore, in the subsequent process, it is possible to grow the semiconductor layer 20 of the group III nitride semiconductor having the m-plane as a growth face on the underlying substrate 10.

It should be noted that, at a time of starting the supply of the group III raw material (a starting time of the first period TP1), if the temperature of the underlying substrate 10 is between 700° C. and 900° C., there is no problem. The temperature is preferably between 750° C. and 850° C., and more preferably between 775° C. and 825° C. In other words, the starting time of the first period TP1 may be immediately before a time t1 when the temperature of the underlying substrate 10 reaches the first temperature T1. If the temperature of the underlying substrate 10 at the time of starting to supply the group III raw material is lower than 700° C., a crystallographic quality (crystallinity) of the semiconductor layer 20 to be grown later is deteriorated. Therefore, the crystallinity of a semiconductor layer (a second semiconductor layer) 30 which will be grown thereafter is also deteriorated. In addition, if the temperature of the underlying substrate 10 at the time of starting to supply the group III raw material is higher than 900° C., the roughness of a surface of the semiconductor layer 20 which will be grown thereafter is increased, which causes cracks.

Further, the length of the first period TP1 is 10 seconds or longer and 300 seconds or shorter. If the length of the first period TP1 is a value between 10 seconds and 300 seconds, there is no problem. However, the length of the first period TP1 is preferably between 30 seconds and 180 seconds, and more preferably between 40 seconds and 120 seconds.

Supposedly, if the length of the first period TP1 is shorter than 10 seconds, the group III raw material is not sufficiently supplied onto the upper surface 10a of the underlying substrate (sapphire) 10. Therefore, the growth of the crystal of the semiconductor layer 20 of the group nitride semiconductor in the subsequent process is not good. If the length of the first period TP1 is longer than 300 seconds, the group III raw material is aggregated on the upper surface 10a of the underlying substrate (sapphire) 10, which causes an abnormal growth (disturbed growth face) in the subsequent process.

In a process (second process) illustrated in 1B of FIG. 1, during a second period TP2 which follows the first period TP1, in a state where the underlying substrate 10 is heated at the first temperature T1, a group V raw material is supplied onto the upper surface 10a of the underlying substrate 10 in addition to the group III raw material. By doing this, in other words, by a vapor phase epitaxial method, the semiconductor layer 20 of the group III nitride semiconductor is grown on the underlying substrate 10. If the group III raw material is a hydride of the group III atom, the vapor phase epitaxial method is, for example, an HVPE (Hydride Vapor Phase Epitaxy) method. Alternatively, if the group III raw material is an organic metal of the group III atom, the vapor phase epitaxial method is, for example, an MOVPE (Metal-Organic Vapor Phase Epitaxy) method.

Specifically, when the first period TP1 finishes, in a state where the temperature of the underlying substrate 10 is maintained at the first temperature T1, the group V raw material starts to be supplied onto the upper surface 10a of the underlying substrate 10 without stopping supplying the group III raw material. In a state where the temperature of the underlying substrate 10 is maintained at the first temperature T1 during the second period TP2, the group III raw material and the group V raw material are simultaneously supplied onto the upper surface 10a of the underlying substrate 10. The semiconductor layer 20 is grown to have a thickness enough to serve as a buffer layer for alleviating the lattice mismatch between the semiconductor layer 30 which is grown thereon in the subsequent process and the underlying substrate 10. The thickness of the semiconductor layer 20 is, for example, several tens nm or larger. In the semiconductor layer 20, the bicrystal contained therein is significantly reduced and the lattice mismatch between the upper surface (crystal surface CS1) of the underlying substrate (sapphire) and the growth face (m-plane) of the semiconductor layer (for example, a GaN layer) 20 is reduced, which improves the crystallinity.

Next (third process), during a third period TP3 which follows the second period TP2, the temperature of the underlying substrate 10 is raised from the first temperature T1 to a second temperature T2 while supplying the group V raw material onto an upper surface 20a of the semiconductor layer 20 without supplying the group III raw material. In other words, as illustrated in 2B of FIG. 2, when the second period TP2 finishes (a time t2), the supplying of the group III raw material onto the upper surface 20a of 20 is stopped. During the time period t2 to t3 (second period TP2), the temperature of the underlying substrate 10 is raised to the second temperature T2 while supplying the group V raw material onto the upper surface 20a of the semiconductor layer 20. The second temperature T2 is a temperature of 100° C. or higher.

Here, if the second temperature T2 is lower than 1000° C. when a semiconductor layer 30 of the group III nitride semiconductor is grown on the semiconductor layer 20 in the subsequent process, the crystallinity of the semiconductor layer 30 may not be sufficiently improved.

Alternatively, supposedly it is considered that during a third period TP3, the temperature of the underlying substrate 10 is raised from the first temperature T1 to the second temperature T2 while supplying both the group III raw material and the group V raw material onto the upper surface 20a of the semiconductor layer 20. In this case, during the third period TP3, the semiconductor layer 30 of the group III nitride semiconductor starts to be grown at a temperature below 1000° C. Therefore, although the semiconductor layer may be grown as a crystal, because the semiconductor layer 30 is grown while changing the temperature, it may be difficult to sufficiently control the growth of the semiconductor layer 30.

In contrast, in the embodiment, during the third period TP3, it is considered that the group V raw material is preferably supplied onto the upper surface 20a of the semiconductor layer 20 without supplying the group III raw material. In other words, the growth of the semiconductor layer 30 of the group III nitride semiconductor does not start. By doing this, after the temperature becomes the second temperature T2 (1000° C. or higher) in the subsequent process, it is possible to start to grow the semiconductor layer 30 of the group III nitride semiconductor.

Alternatively, supposedly it is considered that during the third period TP3, the temperature of the underlying substrate 10 is raised from the first temperature T1 to the second temperature T2 while supplying the group III raw material onto the upper surface 20a of the semiconductor layer 20 without supplying the group V raw material. In this case, during the third period TP3, when the temperature is raised while supplying only the group III raw material, a group III metal is precipitated on a crystal surface to be a trigger, which becomes a cause of a defectiveness of a crystal such as a crystal defect.

In contrast, in the embodiment, during the third period TP3, the group V raw material is supplied onto the upper surface 20a of the semiconductor layer 20 without supplying the group III raw material. Therefore, a new crystal is not precipitated on the crystal surface. However, since the group V raw material is supplied, the crystal is not degraded and a crystal may be grown during a fourth period while maintaining a state where the second period finishes.

In a process (fourth process) illustrated in 1C of FIG. 1, during a fourth period TP4 which follows the third period TP3, in a state where the underlying substrate 10 is heated at the second temperature T2, the group III raw material and the group V raw material are supplied onto the upper surface 20a of the semiconductor layer 20. By doing this, in other words, by a vapor phase epitaxial method, the semiconductor layer (a second semiconductor layer) 30 of the group III nitride semiconductor is grown on the semiconductor layer 20. In the semiconductor layer (for example, a GaN layer) 30, the bicrystal contained therein is significantly reduced and the crystallinity is improved (see FIG. 8)

Therefore, it is possible to obtain a structural body ST in which the underlying substrate 10, the semiconductor layer 20, and the semiconductor layer 30 are laminated in this order. In the structural body ST, as described above, the upper surface 10a of the underlying substrate 10 is a crystal surface CS1 which is tilted at an angle θ1 which is 0.5° or larger and 4° or smaller from the m-plane which belongs to the {1-100} plane group with respect to a normal line of the a-plane which is orthogonal to the m-plane and belongs to the {11-20} plane group (see FIG. 3). Further, the semiconductor layer 20 and the semiconductor layer 30 may be different group III nitride semiconductors. The semiconductor layer 30 may include a device structure such as s an LED, an LD, an FET, an HEMT, or a solar cell. In the semiconductor layer 30, once a crystal is grown in the fourth process under a condition of the fourth process, the crystal growth temperature or a raw material supplying condition may be changed.

In a process illustrated in FIG. 1(d), the underlying substrate 10 is stripped off from the structural body ST. A known method may be used as a method of stripping off the underlying substrate 10 from the structural body ST. By doing this, it is possible to obtain a semiconductor substrate SB including the semiconductor layers 20 and 30.

BRIEF DESCRIPTION OF WORKING EXAMPLE AND COMPARATIVE EXAMPLES

Embodiments of the present invention will be described below, but the following embodiments do not limit the present invention.

The crystal growths of Working Example 1 and Comparative Examples 1 to 4 were checked using an HVPE (Hydride Vapor Phase Epitaxy) method. A hydrogen gas was used as a carrier gas. As the group III raw material, GaCl obtained by reacting an HCl gas and a metal Ga at 750° C. was used. As the group V raw material, an ammonia ($NH_3$) gas was used. A growth pressure was a normal pressure (approximately, 1013 hPa).

It should be noted that nitrogen was used as a carrier gas, although the result is similar to the below. Therefore, the description thereof will be omitted.

Comparative Example 1

A sapphire underlying substrate having an upper surface of a crystal surface which is not tilted from an m-plane (10-10) was annealed at 1040° C. for 10 minutes. Thereafter, ammonia was introduced in the amount of 1 slm for 30 minutes to nitride the upper surface of the sapphire underlying substrate while maintaining the temperature at 1040° C. Thereafter, a GaN layer was grown for 10 minutes to be approximately 30 μm under a condition of V/III ratio=40 while maintaining the temperature at 1040° C. An SEM photograph and a result of an X-ray analysis (ω-2θ scan) of a surface of the grown GaN layer are illustrated in FIG. 10.

Figure 10:
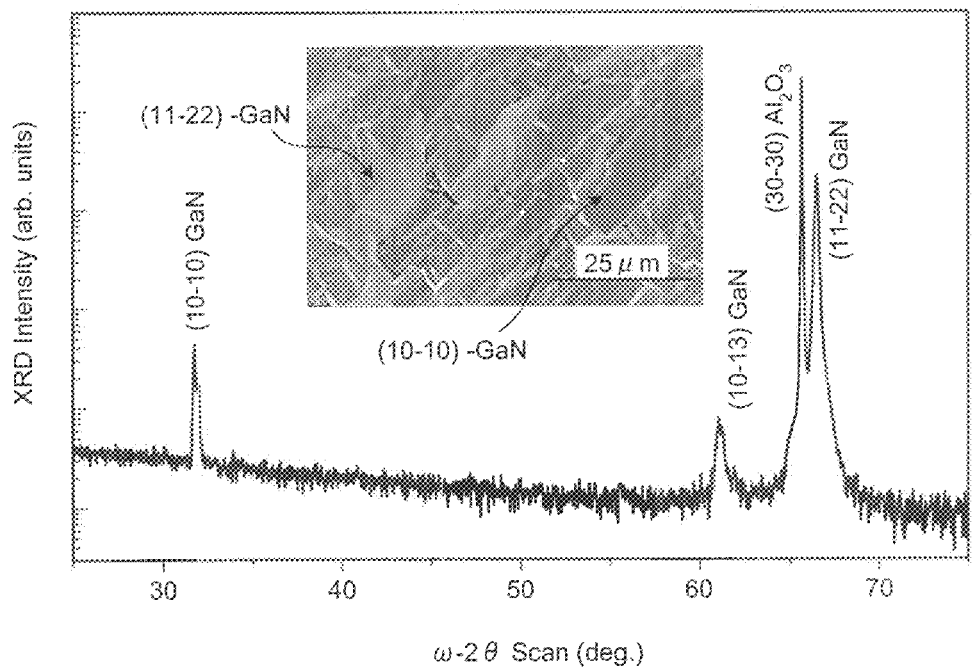
FIG. 10 is a view illustrating a result of an X-ray analysis of a GaN layer according to Comparative Example 1.

As illustrated in the result of the X-ray analysis of FIG. 10, on the GaN layer in Comparative Example 1, a (10-13) plane or a (11-22) plane is also grown in addition to the (10-10) plane. In other words, the GaN layer in the Comparative Example 1 includes other growth face than the (10-10) plane (m-plane), which is not a GaN layer (semiconductor layer) having a desired growth face.

Further, as illustrated in the SEM photograph of FIG. 10, the GaN layer in the Comparative Example 1 has an uneven surface having lots of irregularities. Therefore, it is considered that the GaN layer in the Comparative Example 1 has lots of bicrystals.

Comparative Example 2

Figure 4:
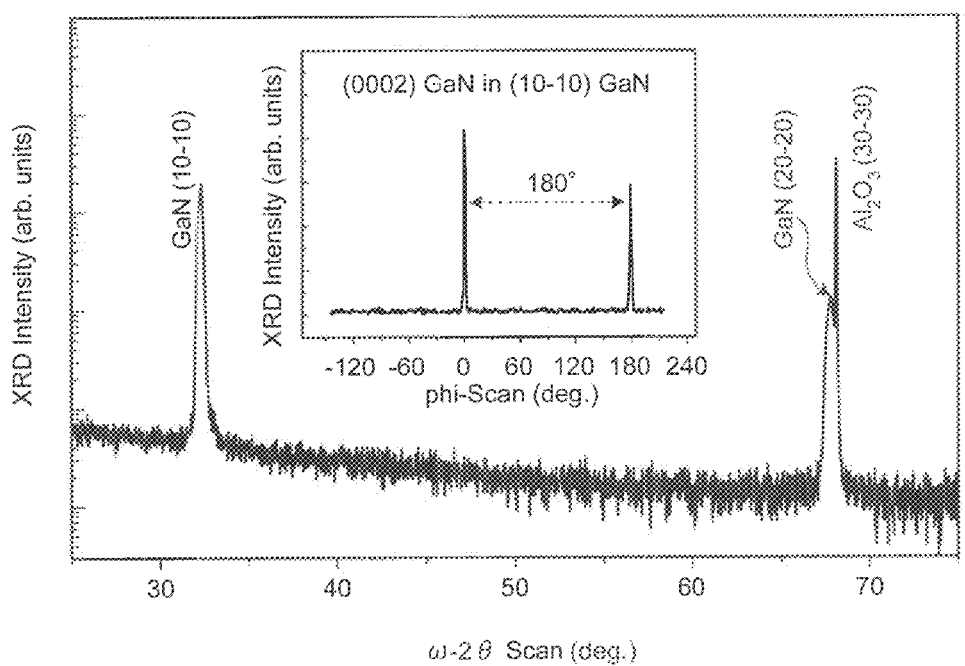
FIG. 4 is a view illustrating a result of an X-ray analysis of a GaN layer according to Comparative Example 2.

Using a sapphire underlying substrate having an upper surface of a crystal surface which is not tilted from an m-plane (10-10), only hydrogen carrier gas was introduced. After the temperature of the underlying substrate become 800° C., under the condition of 25 sccm and for one minute, a GaCl gas (group III raw material) was supplied without supplying the ammonia gas (group V raw material). Thereafter, the GaCl gas (group III raw material) and the ammonia gas (group V raw material) were supplied to grow a gallium nitride buffer layer (semiconductor layer) for 5 minutes under a condition of V/III ratio=50 while maintaining the temperature of the underlying substrate at 800° C. Thereafter, the supplying of the GaCl gas (group III raw material) was stopped but the ammonia gas (group V raw material) and the carrier gas were supplied to raise the temperature up to 1040° C. which is the crystal growth temperature. After reaching 1040° C. which is the crystal growth temperature, the GaCl gas (group III raw material) was supplied again for 10 minutes under the condition of V/III ratio=40 to grow the GaN layer (semiconductor layer) of (10-10) to be approximately 30 μm. The result of the X-ray analysis (ω-2θ scan) of the grown GaN layer is illustrated in FIG. 4. An optical photomicrograph of the surface of the grown GaN layer is the same as the optical photomicrograph illustrated in 5A of FIG. 5.

As illustrated in the result of the X-ray analysis of FIG. 4, it is understood that in the GaN layer of Comparative Example 2, the (10-10) plane (m-plane) is grown but the other planes are not grown. In other words, since the GaN layer of Comparative Example 2 does not contain a growth face other than the (10-10) plane (m-plane) the GaN layer (semiconductor layer) has a desired growth face.

Figure 5:
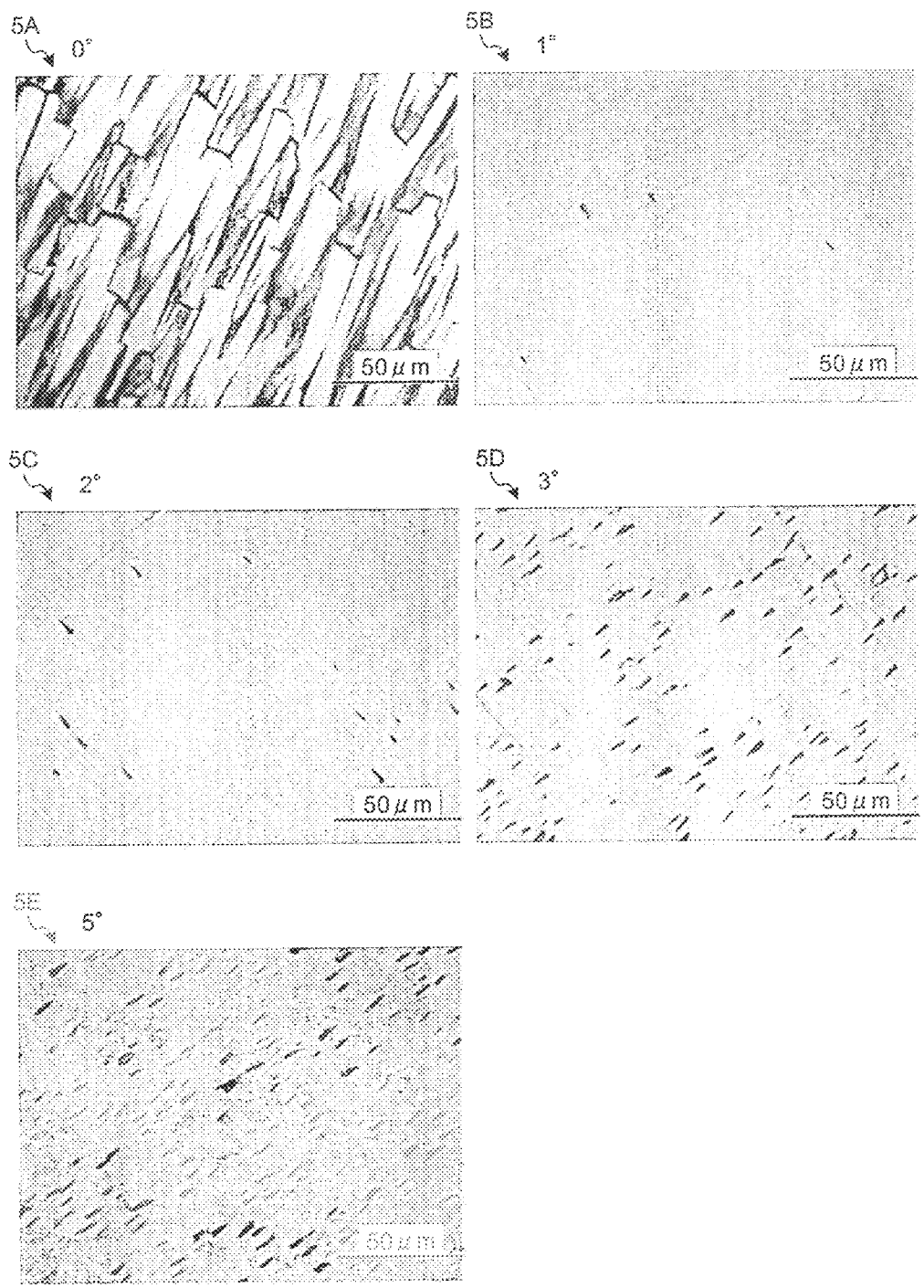
FIG. 5 is an optical photomicrograph of a surface of a GaN layer according to Working Example 1.

However, as illustrated in the optical photomicrograph of 5A of FIG. 5, the GaN layer of Comparative Example 2 still has an uneven surface containing lots of irregularities. Therefore, it is considered that the GaN layer of Comparative Example 2 still contains lots of bicrystals.

Further, during the growth, even though the time when the ammonia gas (group V raw material) is not supplied but the GaCl gas (group III raw material) is supplied is hanged between 10 seconds and 300 seconds, the obtained results were similar. In addition, even though the starting temperature for supplying the GaCl gas (group III raw material) was checked between 700° C. and 900° C., similar results were obtained. Furthermore, thereafter, the buffer layer (semiconductor layer) is continuously grown in the range of V/III ratio=20 to 100 and the growth time changed in a range of 1 to 60 minutes. Also in these cases, similar results were obtained.

As described above, in the above-described embodiments, it is confirmed that in the state where the sapphire underlying substrate 10 is heated at the first temperature T1 during the first period TP1, the group III raw material is supplied onto the upper surface 10a of the underlying substrate 10 without supplying the group V raw material, which effectively obtains the GaN layer (semiconductor layer) having a desired growth face (m-plane) but is insufficient to reduce the bicrystals in the GaN layer.

Comparative Example 3

Figure 9:
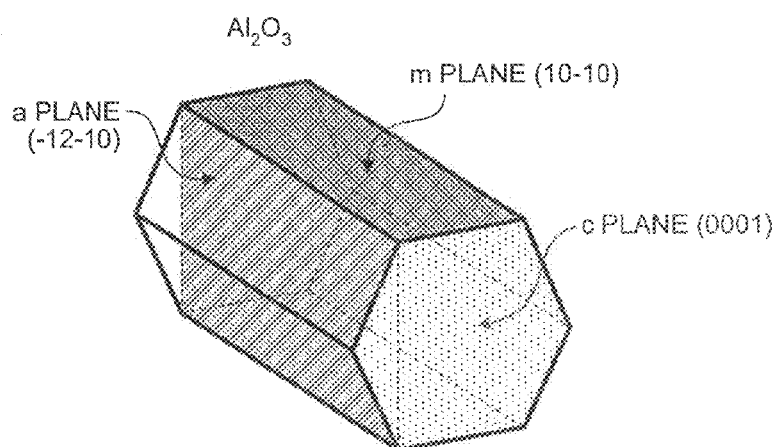
FIG. 9 is a view explaining a crystal surface according to Comparative Example 3.
Figure 9:
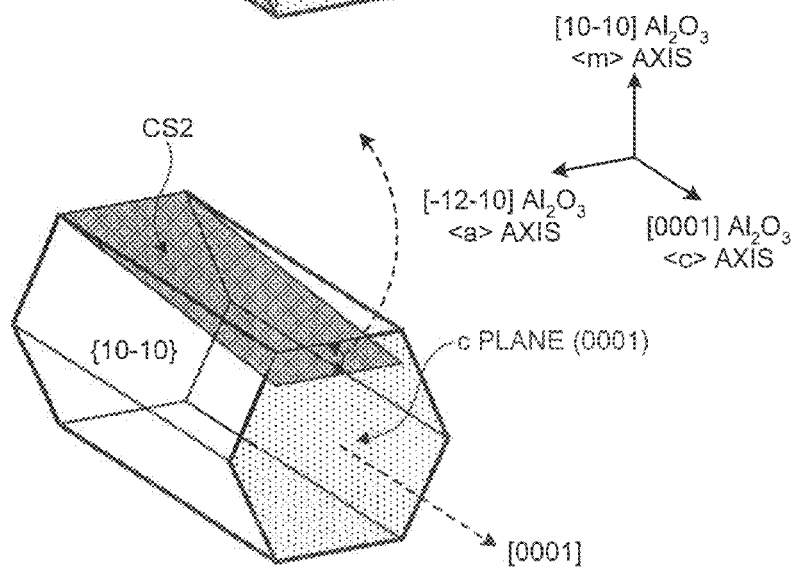
Figure 9:
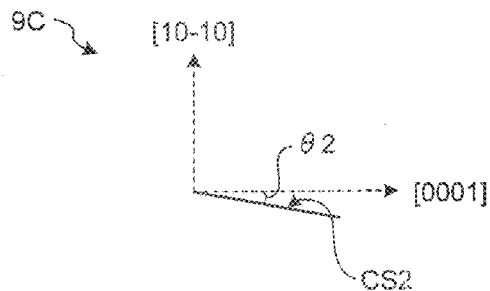

Next, a sapphire underlying substrate having an upper surface of a crystal surface which is tilted at 0°, 1°, and 2° in a <0001> direction from the m-plane (10-10) was prepared. When the upper surface is tilted at 1° and 2°, as illustrated in FIG. 9, the upper surface of the underlying substrate is a crystal surface CS2 which is tilted at an angle θ2 from the m-plane (10-10) with respect to a normal line [0001] of a c-plane (0001). The m-plane is a plane belonging to {1-100} plane group. The c-plane is a plane which is orthogonal to the m-plane and belongs to the {0001} plane group.

After the temperature at which the underlying substrate is heated become 800° C., the GaCl gas (group III raw material) was introduced under the condition of 25 sccm for one minute. Thereafter, the gallium nitride buffer layer (semiconductor layer) was grown to be 2.5 μm at 800° C. for 5 minutes under the condition of V/III ratio=50. An observation result of the surface of the grown buffer layer (semiconductor layer) by an optical microscope is illustrated in FIG. 11. 11A, 11B, and 11C of FIG. 11 illustrate the surface of the buffer layer (semiconductor layer) which was grown on the sapphire underlying substrate having an upper surface of a crystal surface which is tilted at 0°, 1°, and 2° in a <0001> direction from the m-plane (10-10), respectively.

Figure 11:
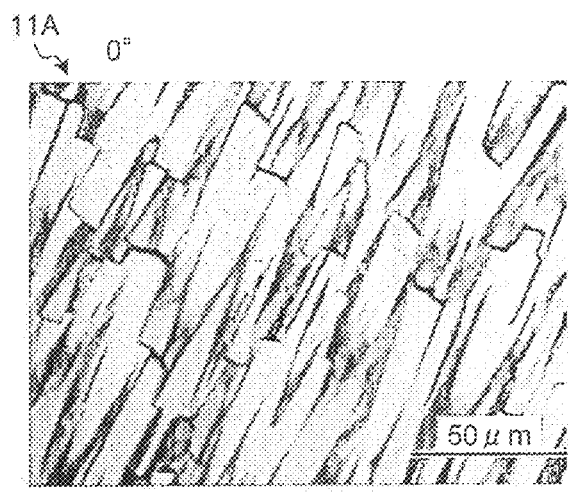
FIG. 11 is an optical photomicrograph of a surface of GaN buffer layer according to Comparative Example 3.
Figure 11:
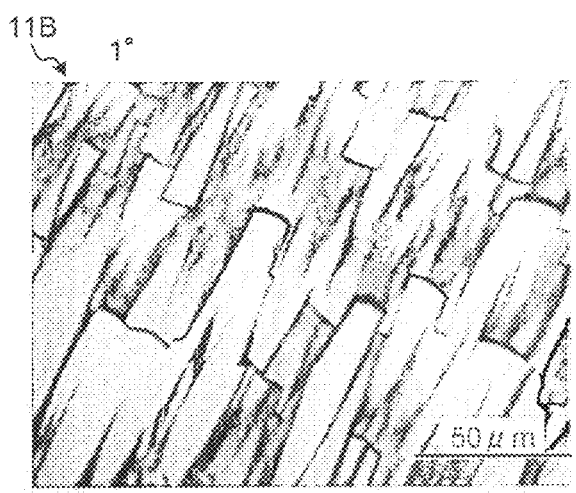
Figure 11:
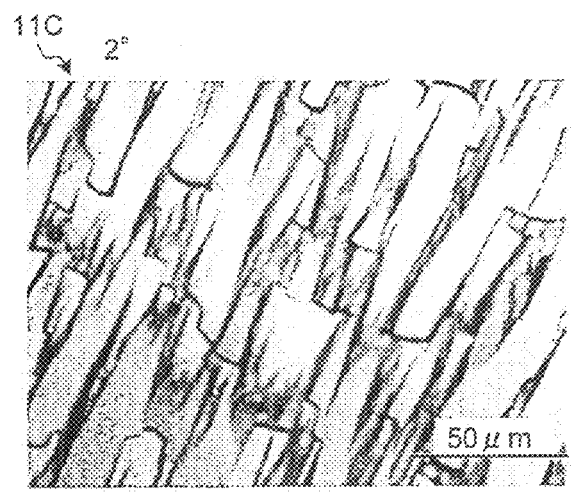

As illustrated in the optical photomicrograph of 11A, 11B, and 11C of FIG. 11, when the upper surface is tilted in the <0001> direction, similarly to the case when the upper surface is not tilted from the m-plane (10-10), a shape similar to a rectangle or a thin and long triangle was observed on the surface.

In order to check the cause of the shape, a surface of the GaN buffer layer when the sapphire underlying substrate is tilted at 1° from the m-plane (10-10) in the <0001> direction was etched for 10 minutes using KOH solution of 0.25 mol/L a temperature of 200° C. The SEM photograph of the resultant surface is illustrated in FIG. 12.

Figure 12:
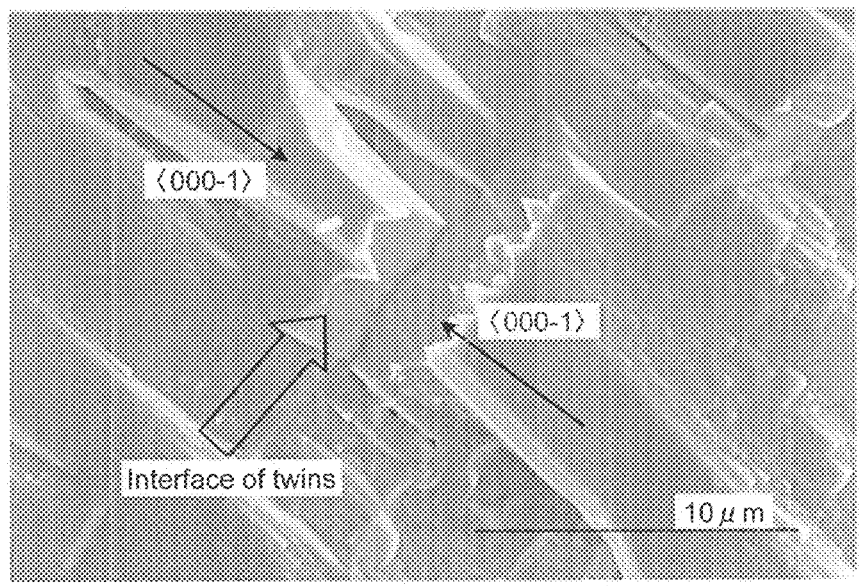
FIG. 12 is an SEM photograph of a surface of a GaN buffer layer according to Comparative Example 3.

As illustrated in the SEM photograph of FIG. 12, it was observed that an interface of short sides of the rectangle is deeply etched. It is considered that at the deeply etched portion, two N atom planes of a crystal lattice of GaN, that is, two (000-1) planes face each other. In other words, if it is considered together with the result of the X-ray analysis (a phi-scan diagram which is a smaller XRD chart in FIG. 4) in which similar peaks are obtained when the plane rotates at 180°, it is understood that a bicrystal which is mirror symmetrical to a surface orthogonal to a linearly shown surface is formed.

Further, the GaCl gas (group III raw material) stopped being supplied to the GaN buffer layer which was not etched when using the sapphire underlying substrate having the upper surface of the crystal surface tilted at 1° in the <0001> direction from the m-plane (10-10). However, while supplying the ammonia gas (group V raw material) and the carrier gas, the temperature was raised to 1040° C. which is the crystal growth temperature. After reaching 1040° C. which is the crystal growth temperature, the GaCl gas (group III raw material) was supplied again for 10 minutes under the condition of V/III ratio=40 to grow the GaN layer (semiconductor layer) of (10-10) to be approximately 30 μm. The SEM photograph of the surface of the grown GaN layer is illustrated in FIG. 13.

Figure 13:
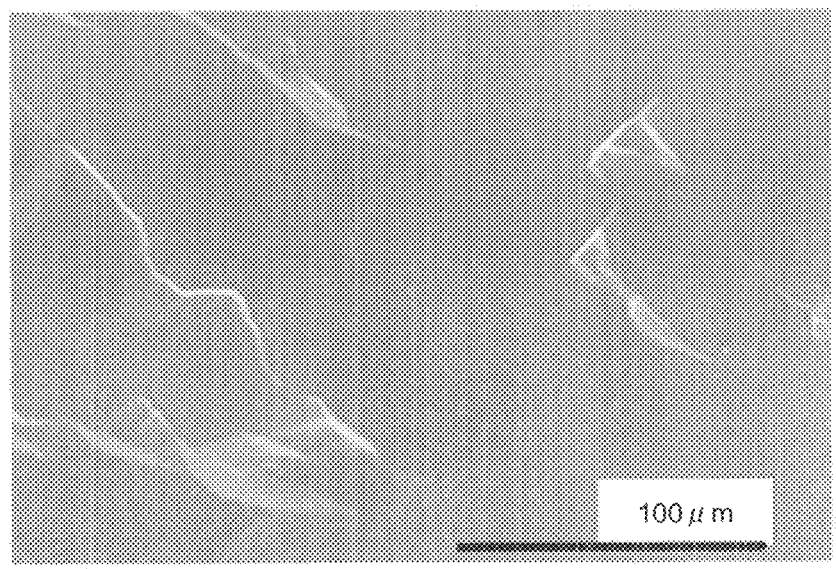
FIG. 13 is an SEM photograph of a surface of a GaN layer according to Comparative Example 3.

As illustrated in the SEM photograph of FIG. 13, it is apparently understood that scarious defects are present on the surface of the GaN layer which is grown on the sapphire underlying substrate having the upper surface of the crystal surface tilted at 1° in the <0001> direction from the m-plane (10-10).

As described above, it is confirmed that the growing of the semiconductor layer of the group III nitride semiconductor (buffer layer) on the sapphire underlying substrate having the upper surface of the crystal surface tilted in the <0001> direction from the m-plane (10-10) is not effective to reduce the bicrystals in the GaN layer.

Working Example 1

Next, a sapphire underlying substrate having an upper surface of a crystal surface which is tilted at 0°, 1°, 2°, 3°, and 5° in a <-12-10> direction from the m-plane (10-10) was prepared. Under similar condition to Comparative Example 3, the GaN buffer layer (semiconductor layer) was grown on the underlying substrate to be 2.5 μm. An observation result of the surface of the grown GaN buffer layer by an optical microscope is illustrated in FIG. 5. The bicrystal present when the underlying substrate which is not tilted from (10-10) is used completely disappears at the timing when the upper surface is tilted at 1° in the <-12-10> direction. However, as the tilted angle becomes larger, the pit shaped defect tends to be increased.

FIG. 6 is a graph illustrating the relationship between the defect density (pit density) and the tilted angle. As illustrated in FIG. 6, it is understood that in order to make the defect density which is considered to be required to make a good light emitting element be Dth1=$5\times10^5$ cm$^{-2}$ or less, the tilted angle in the <-12-10> direction from (10-10) may be 4° or smaller.

Figure 7:
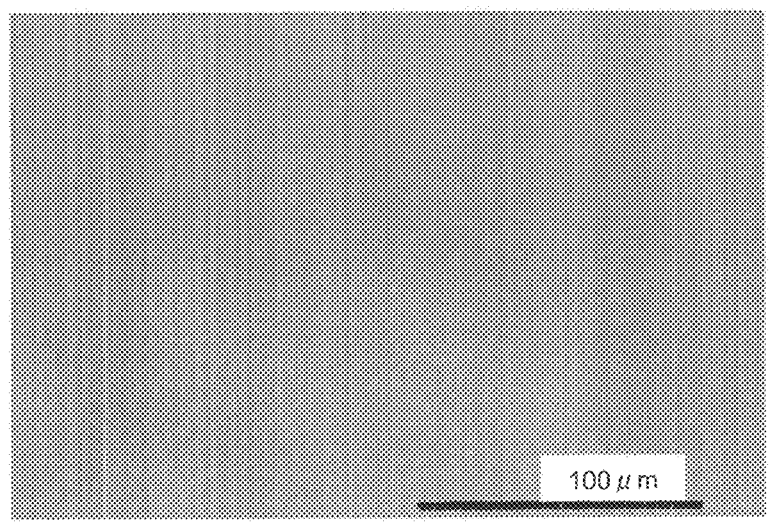
FIG. 7 is an SEM photograph of a surface of a GaN buffer layer of according to Working Example 1.

Further, an SEM photograph of the surface of the GaN buffer layer grown on the sapphire underlying substrate having an upper surface of a crystal surface which is tilted at 1° in a <-12-10> direction from the m-plane (10-10) is illustrated in FIG. 7. As illustrated in the SEM photograph of FIG. 7, the GaN buffer layer in the Example 1 has a very smooth and flat surface. Therefore, it is considered that the bicrystals are significantly reduced in the GaN layer of Working Example 1.

Figure 8:
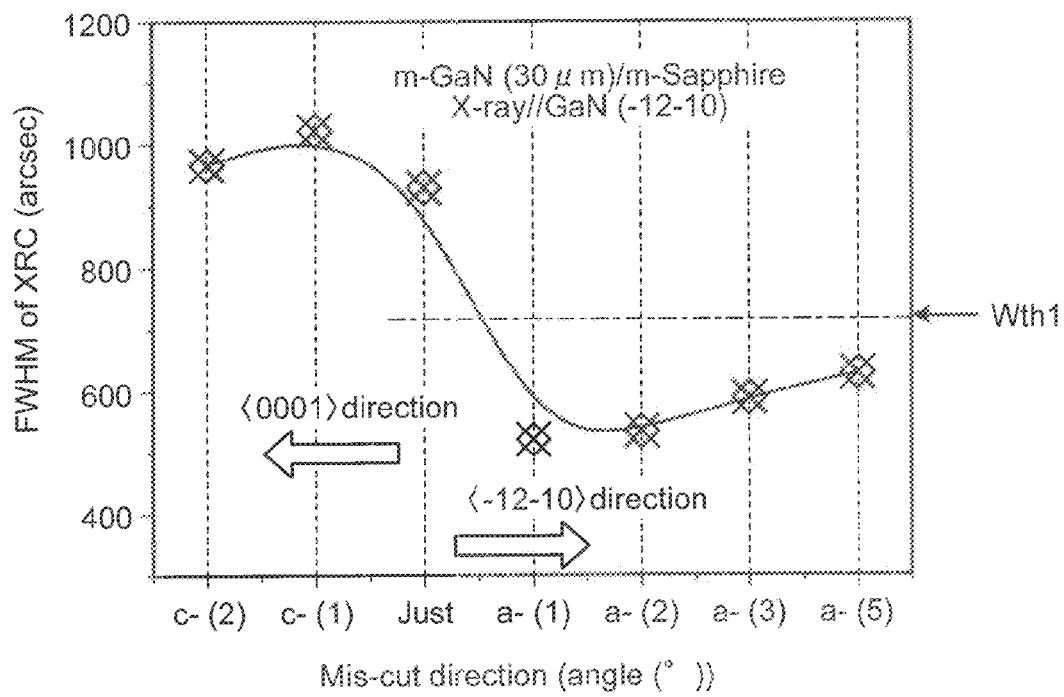
FIG. 8 is a view illustrating a relationship between an X-ray half value width and a tilted angle according to Working Example 1.

In addition, a result of the X-ray analysis (a full width at a half maximum (FWHM) of an X-ray rocking curve of (10-10)) of the surface of the GaN buffer layer grown on the sapphire underlying substrate having an upper surface of a crystal surface which is tilted at 0°, 1°, 2°, 3°, and 5° in a <-12-10> direction from the m-plane (10-10) is illustrated in FIG. 8 as "Just", "a-(1)", "a-(2)", "a-(3)", and "a-(5)". It should be noted that, in FIG. 8, a result of the X-ray analysis of the surface of the GaN buffer layer grown on the sapphire underlying substrate having an upper surface of a crystal surface which is tilted at 1° and 2° in a <0001> direction from the m-plane (10-10) in Comparative Example 3 is also illustrated as "c-(1)" and "c-(2)" for comparison.

As illustrated in FIG. 8, it is understood that the X-ray full width at a half maximum is significantly reduced and the crystallinity is drastically improved from "Just" to "a-(1)". In other words, it is understood that a critical value of the angle tilted in the <-12-10> direction from the m-plane (10-10) is 0.5. In this case, if the value of the X-ray full width at a half maximum is set to a threshold value Wth1, the X-ray full width at a half maximum under any of conditions "a-(1)", "a-(2)", "a-(3)", and "a-(5)" falls into the threshold value Wth1 or lower. In other words, it is understood that the GaN buffer layer under any of the conditions "a-(1)", "a-(2)", "a-(3)", and "a-(5)" has a good crystallinity.

As described above, in the above embodiment, it is confirmed that the upper surface 10a of the underlying substrate 10 is the crystal surface CS1 which is tilted at an angle θ1 (a value of 0.5° or larger and 4° or smaller) with respect to the normal line of the a-plane from the m-plane, which is an effective condition to reduce the bicrystals in the semiconductor layer and improve the crystallinity of the semiconductor layer when the semiconductor layer (for example, GaN layer) of the group III nitride semiconductor is grown thereon.

In the meantime, as illustrated in FIG. 8, it is confirmed that the X-ray full width at a half maximum under the conditions of "c-(1)" and "c-(2)" is similar to the X-ray full width at a half maximum under the condition of "Just", which is not effective to improve the crystallinity of the semiconductor layer.

REFERENCE SIGNS LIST

10 Underlying substrate
20 Semiconductor layer
30 Semiconductor layer
SB Semiconductor substrate
ST Structural body

The invention claimed is:

1. A method for manufacturing a semiconductor substrate, comprising:
a first step of, during a first period, treating an upper surface of a sapphire underlying substrate by supplying a group III raw material onto the upper surface of the underlying substrate without supplying a group V raw material in a state where the sapphire underlying substrate is heated at a first temperature; and
a second step of, during a second period which follows the first period, growing a semiconductor layer of the group III nitride semiconductor on the underlying substrate by supplying the group V raw material in addition to the group III raw material on the upper surface of the underlying substrate in the state where the underlying substrate is heated at the first temperature,
wherein the upper surface of the underlying substrate is a crystal surface tilted at an angle of 0.5° or larger and 4° or smaller with respect to a normal line of an a-plane which is orthogonal to an m-plane and belongs to a {11-20} plane group, from the m-plane which belongs to a {1-100} plane group.

2. The method for manufacturing the semiconductor substrate according to claim 1, wherein
a length of the first period is 10 seconds or longer and 300 seconds or shorter.

3. The method for manufacturing the semiconductor substrate according to claim 1, further comprising:
a third step of, during a third period which follows the second period, raising the temperature of the underlying substrate from the first temperature to a second temperature while supplying the group V raw material onto the upper surface of the semiconductor layer without supplying the group III raw material; and
a fourth step of, during a fourth period which follows the third period, growing a second semiconductor layer of the group III nitride semiconductor on the semiconductor layer by supplying the group III raw material and the group V raw material onto the upper surface of the semiconductor layer in the state where the underlying substrate is heated at the second temperature.

4. The method for manufacturing the semiconductor substrate according to claim 2, further comprising:
a third step of, during a third period which follows the second period, raising the temperature of the underlying substrate from the first temperature to a second temperature while supplying the group V raw material onto the upper surface of the semiconductor layer without supplying the group III raw material; and
a fourth step of, during a fourth period which follows the third period, growing a second semiconductor layer of the group III nitride semiconductor on the semiconductor layer by supplying the group III raw material and the group V raw material onto the upper surface of the semiconductor layer in the state where the underlying substrate is heated at the second temperature.

5. A structural body, comprising:
a sapphire underlying substrate; and
a semiconductor layer of a group III nitride semiconductor disposed on the underlying substrate,
wherein an upper surface of the underlying substrate is a crystal surface tilted at an angle of 0.5° or larger and 4° or smaller with respect to a normal line of an a-plane which is orthogonal to an m-plane and belongs to a {11-20} plane group, from the m-plane which belongs to a {1-100} plane group,
and wherein the semiconductor layer has flat surface.

6. The structural body according to claim 5, wherein
a pit density of the surface of the semiconductor layer is $5\times10^5$ cm$^{-2}$ or less.

* * * * *